United States Patent
Kuriki

(10) Patent No.: US 9,439,283 B2
(45) Date of Patent: Sep. 6, 2016

(54) CONDUCTIVE SHEET

(71) Applicant: FUJIFILM Corporation, Minato-ku, Tokyo (JP)

(72) Inventor: Tadashi Kuriki, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/703,072

(22) Filed: May 4, 2015

(65) Prior Publication Data

US 2015/0237723 A1   Aug. 20, 2015

Related U.S. Application Data

(62) Division of application No. 13/511,551, filed as application No. PCT/JP2010/070939 on Nov. 24, 2010, now Pat. No. 9,052,786.

(30) Foreign Application Priority Data

Nov. 24, 2009   (JP) ................. 2009-266754

(51) Int. Cl.
  *H03K 17/975* (2006.01)
  *H05K 1/02* (2006.01)
  *G06F 3/044* (2006.01)
(52) U.S. Cl.
  CPC ............ *H05K 1/0298* (2013.01); *G06F 3/044* (2013.01); *G06F 2203/04103* (2013.01); *G06F 2203/04112* (2013.01); *H05K 2201/09245* (2013.01)
(58) Field of Classification Search
  CPC ............... G06F 3/044; G06F 2203/04112; G06F 3/041; G06F 1/1692; G06F 1/13338; G06F 2203/04102; G06F 3/047; H05K 3/1258; H05K 1/0213; H05K 1/02
  USPC .......................................... 200/600
  See application file for complete search history.

(56) References Cited

U.S. PATENT DOCUMENTS

| 7,129,935 B2 | 10/2006 | Mackey |
| 7,737,617 B2 | 6/2010 | Miyazaki et al. |
| 7,864,503 B2 | 1/2011 | Chang |

(Continued)

FOREIGN PATENT DOCUMENTS

| JP | 2008310551 A | 12/2008 |
| JP | 2009211531 A | 9/2009 |

(Continued)

OTHER PUBLICATIONS

Communication, dated Nov. 6, 2015, issued in corresponding EP Application No. 10833229.7, 6 pages in English.

(Continued)

*Primary Examiner* — Kyung Lee
(74) *Attorney, Agent, or Firm* — Sughrue Mion, PLLC

(57) ABSTRACT

Disclosed are a conductive sheet, a usage method of the conductive sheet and a capacitive type touch panel. For a first conductive sheet, two or more conductive first large grids are formed atop a first transparent base, wherein each first large grid is constituted by combining two or more small grids, and the shapes of facing sides of each first large grid are formed to alternate. For example, rectangular waveshapes of a first side portion of the first large grid and of a fourth side portion facing the first side portion are made to alternate, and rectangular waveshapes of a second side portion of the first large grid and of a third side portion facing the second side portion are made to alternate.

5 Claims, 9 Drawing Sheets

(56) References Cited

U.S. PATENT DOCUMENTS

| | | |
|---|---|---|
| 8,274,494 B2 | 9/2012 | Frey et al. |
| 8,586,874 B2 | 11/2013 | Kuriki |
| 8,686,308 B2 | 4/2014 | Kuriki |
| 2008/0211395 A1 | 9/2008 | Koshihara et al. |
| 2008/0277259 A1 | 11/2008 | Chang |
| 2009/0002337 A1 | 1/2009 | Chang |
| 2010/0156840 A1 | 6/2010 | Frey et al. |
| 2011/0102370 A1 | 5/2011 | Kono et al. |

FOREIGN PATENT DOCUMENTS

| | | |
|---|---|---|
| JP | 2010039537 A | 2/2010 |
| KR | 1020090015414 A | 2/2009 |

OTHER PUBLICATIONS

Rejection of the Application, dated Mar. 11, 2014, issued in corresponding JP Application No. 2010-261304, 4 pages in English and Japanese.

Decision of Rejection, dated Jun. 17, 2014, issued in corresponding JP Application No. 2010-261304, 4 pages in English and Japanese.

Notification of the First Office Action, dated Sep. 1, 2014, issued in corresponding CN Application No. 201080053150.9, 21 pages in English and Chinese.

Notification of Reasons for Rejection, dated Nov. 30, 2015, issued in corresponding KR Application No. 10-2012-7013446, 8 pages in English and Korean.

Communication dated Jul. 4, 2016 from the European Patent Office issued in corresponding Application No. 10833229.7.

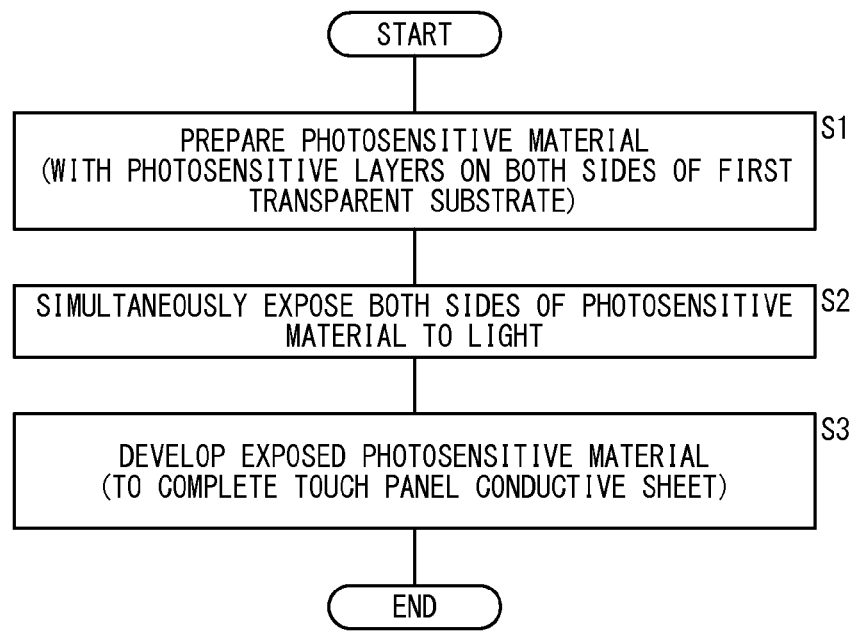

CONDUCTIVE SHEET

CROSS REFERENCE TO RELATED APPLICATIONS

This application is a divisional of U.S. application Ser. No. 13/511,551, filed May 23, 2012, which is a National Stage of International Application No. PCT/JP2010/070939 filed Nov. 24, 2010, claiming priority based on Japanese Patent Application No. 2009-266754, filed Nov. 24, 2009, the contents of all of which are incorporated herein by reference in their entirety.

TECHNICAL FIELD

The present invention relates to a conductive sheet, a method for using a conductive sheet, and a capacitive touch panel, and for example to a conductive sheet suitable for use in a projected capacitive touch panel, a method for using a conductive sheet, and a capacitive touch panel.

BACKGROUND ART

Common capacitive touch panels are position input devices capable of detecting a human finger touch position based on an electrostatic capacitance change between the finger and a conductive film. Such capacitive touch panels include surface capacitive touch panels and projected capacitive touch panels. The surface capacitive touch panel has a simple structure but is incapable of simultaneously detecting two or more touch points (multi-touch detection). On the other hand, the projected capacitive touch panel has a structure containing a large number of electrodes arranged in a matrix, similar to a pixel structure of a liquid crystal display device, etc. More specifically, the structure is such that a plurality of electrodes are arranged and connected in series in the vertical direction to form a first electrode array, a plurality of the first electrode arrays are arranged in the horizontal direction, a plurality of electrodes are arranged and connected in series in the horizontal direction to form a second electrode array, a plurality of the second electrode arrays are arranged in the vertical direction, and capacitance changes are sequentially detected by the first and second electrode arrays to achieve multi-touch detection. Such conventional projected capacitive touch panels include a capacitive input device described in Japanese Laid-Open Patent Publication No. 2008-310551.

SUMMARY OF INVENTION

However, the capacitive input device described in Japanese Laid-Open Patent Publication No. 2008-310551 is disadvantageously poor in finger position detection accuracy because it is necessary to form gaps between first and second electrode arrays arranged on one main surface of a substrate to prevent short circuit of the first and second electrode arrays. Furthermore, the capacitive input device is disadvantageous in that electrode connections of the second electrode arrays are formed on electrode connections of the first electrode arrays with insulation layers in between to prevent short circuit of intersections (cross points) of the first and second electrode arrays, whereby the intersections have large thicknesses and appear as local black points in the touch panel surface to significantly deteriorate the visibility. In addition, mask patterns are required to form the insulation layers and the electrode connections thereon, thereby resulting in complicated production process and high production cost.

The problems may be solved by using a structure containing the first electrode arrays formed on one main surface of a transparent substrate and the second electrode arrays formed on the other main surface thereof.

However, this structure may cause the following problem in the future. Though the projected capacitive touch panel has currently been used mainly in small devices such as PDAs (personal digital assistants) and mobile phones, the touch panel is expected to be used in large devices such as personal computer displays. This is because a standard operating system (OS) for a personal computer has recently been made compliant with a multi-touch technology.

The electrodes used in the conventional projected capacitive touch panel are composed of ITO (indium tin oxide) and therefore have high resistance of several hundred ohm/sq. Thus, if the touch panel is used in the large devices in the above future trend, the large-sized touch panel exhibits a low current transfer rate between the electrodes, and thereby exhibits a low response speed (a long time between finger contact and touch position detection).

In view of the above problems, an object of the present invention is to provide a conductive sheet and a conductive sheet using method, where the conductive sheet can have a low-resistance conductive pattern on a substrate, can exhibit an improved visibility, and can be suitably used in a projected capacitive touch panel or the like.

Another object of the present invention is to provide a projected capacitive touch panel that can have a low-resistance conductive pattern on a substrate, can exhibit an improved visibility, and can be suitably used as a large-sized projected capacitive touch panel or the like.

[1] A conductive sheet according to a first aspect of the present invention, comprises two or more conductive large lattices formed on a substrate, wherein the large lattices each contain a combination of two or more small lattices, the large lattices each have sides that are opposite to each other, and shapes of the sides are alternated.

[2] In the first aspect of the present invention, the sides of each of the large lattices have rectangular wave shapes in which two or more rectangular shapes are arranged, and one of the sides of each of the large lattices is opposite to the other side, and the other side has non-protrusive portions opposite to rectangular protrusive portions of the one of the sides and rectangular protrusive portions opposite to non-protrusive portions of the one of the sides.

[3] In the first aspect of the present invention, the rectangular shapes of the sides of each of the large lattices comprise the small lattices.

[4] In the first aspect of the present invention, a connection is formed on the substrate and electrically connects the adjacent large lattices, the two or more large lattices are arranged in one direction with the connection disposed therebetween.

[5] In the first aspect of the present invention, the two or more large lattices are arranged in a first direction with the connection disposed therebetween to form a conductive pattern, two or more of the conductive patterns are arranged in a second direction perpendicular to the first direction, and an electrically isolated insulation is disposed between the adjacent conductive patterns.

[6] A conductive sheet according to a second aspect of the present invention, comprises a substrate, wherein two or more conductive first large lattices are formed on one main surface of the substrate, two or more conductive second large lattices are formed on the other main surface of the substrate, the first large lattices and the second large lattices each contain a combination of two or more small lattices, and the first large lattices and the second large lattices each have sides that are opposite to each other, and shapes of the sides are alternated.

[7] In the second aspect of the present invention, the sides of each of the first large lattices and the second large lattices have rectangular wave shapes in which two or more rectangular shapes are arranged, and one of the sides of each of the first large lattices and the second large lattices is opposite to the other side, and the other side has non-protrusive portions opposite to rectangular protrusive portions of the one of the sides and rectangular protrusive portions opposite to non-protrusive portions of the one of the sides.

[8] A conductive sheet according to a third aspect of the present invention, comprises a substrate, wherein two or more conductive first large lattices are formed on one main surface of the substrate, two or more conductive second large lattices are formed on the other main surface of the substrate, the first large lattices and the second large lattices each contain a combination of two or more small lattices, and one side of the first large lattices and one side of the second large lattices face each other, and shapes of the sides are alternated.

[9] In the third aspect of the present invention, the sides of each of the first large lattices and the second large lattices have rectangular wave shapes in which two or more rectangular shapes are arranged, and one of the sides of each of the first large lattices faces one of the sides of each of the second large lattices, and the one of the sides of each of the second large lattices has non-protrusive portions facing rectangular protrusive portions of the one of the sides of each of the first large lattices and rectangular protrusive portions facing non-protrusive portions of the one of the sides of each of the first large lattices.

[10] In the second or third aspect of the present invention, the rectangular shapes of the sides of each of the first large lattices and the second large lattices comprise the small lattices.

[11] In the second or third aspect of the present invention, a first connection is formed on the one main surface of the substrate and electrically connects the adjacent first large lattices, a second connection is formed on the other main surface of the substrate and electrically connects the adjacent second large lattices, the two or more first large lattices are arranged in a first direction with the first connection disposed therebetween to form a first conductive pattern, the two or more second large lattices are arranged in a second direction, which is perpendicular to the first direction, with the second connection disposed therebetween to form a second conductive pattern, two or more of the first conductive patterns are arranged in the second direction, two or more of the second conductive patterns are arranged in the first direction, an electrically isolated first insulation is disposed between the adjacent first conductive patterns, an electrically isolated second insulation is disposed between the adjacent second conductive patterns, the first connection and the second connection are arranged facing each other with the substrate in between, and the first insulations and the second insulations are arranged facing each other with the substrate in between.

[12] In the first, second, or third aspect of the present invention, the small lattices have a polygonal shape.

[13] In the first, second, or third aspect of the present invention, wherein the small lattices have a square shape.

[14] According to a fourth aspect of the present invention, there is provided a method for using a conductive sheet, comprising using a first conductive sheet and a second conductive sheet, wherein the first conductive sheet comprises two or more conductive first large lattices, the first large lattices each containing a combination of two or more small lattices, the second conductive sheet comprises two or more conductive second large lattices, the second large lattices each containing a combination of two or more small lattices, the first large lattices and the second large lattices each have sides that are opposite to each other, shapes of the sides being alternated, and the first conductive sheet and the second conductive sheet are combined, so that the second large lattices are disposed adjacent to the first large lattices, and that one side of the first large lattices and one side of the second large lattices form in combination an arrangement of the small lattices.

[15] A capacitive touch panel according to a fifth aspect of the present invention, comprises the conductive sheet according to the second or third aspect of the present invention.

As described above, in the conductive sheet and the conductive sheet using method of the present invention, the resistance of the conductive pattern formed on the substrate can be lowered, the visibility can be improved, and the conductive sheet can be suitably used in a projected capacitive touch panel or the like.

Furthermore, in the capacitive touch panel of the present invention, the resistance of the conductive pattern formed on the substrate can be lowered, the visibility can be improved, and the touch panel can be suitably used as a large-sized projected capacitive touch panel or the like.

BRIEF DESCRIPTION OF DRAWINGS

FIG. 7 is a flowchart of a method for producing a transparent conductive film according to a present embodiment;

DESCRIPTION OF EMBODIMENTS

Several embodiments of the conductive sheet, the conductive sheet using method, and the touch panel of the present invention will be described below with reference to FIGS. 1 to 9. It should be noted that, in this description, a numeric range of "A to B" includes both the numeric values A and B as the lower limit and upper limit values.

Figure 1:
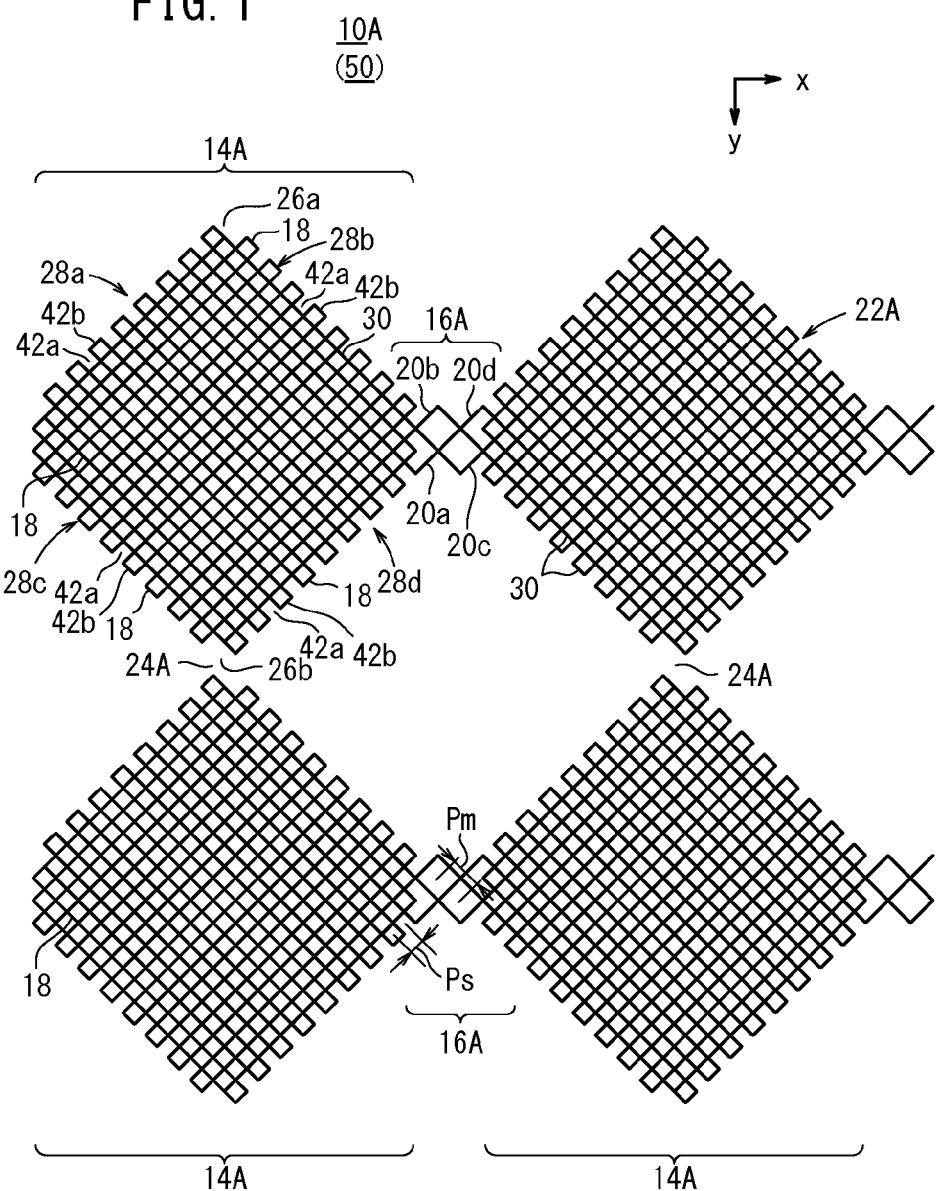
FIG. 1 is a plan view showing an example of a first conductive pattern formed on a first conductive sheet.
Figure 2:
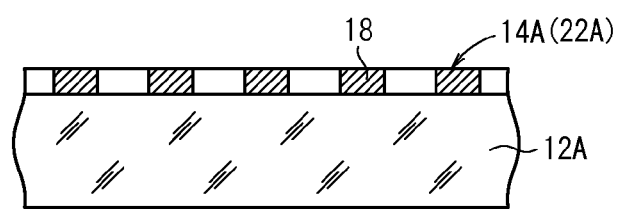
FIG. 2 is a cross-sectional view partially showing the first conductive sheet.

As shown in FIG. 1, a conductive sheet according to a first embodiment (hereinafter referred to as "first conductive sheet 10A") has two or more conductive first large lattices 14A composed of a thin metal wire formed on one main surface of a first transparent substrate 12A (see FIG. 2). Each of the first large lattices 14A comprises a combination of two or more small lattices 18. The first large lattices 14A each have the sides that are opposite to each other, and the shapes of the sides are alternated. First connections 16A composed of a thin metal wire are formed between adjacent ones of the first large lattices 14A and electrically connect these adjacent first large lattices 14A to each other. The first connections 16A each contain one or more medium lattices 20 (20a through 20d), and the pitch of the medium lattices 20 is n times large than that of the small lattices 18 (in which n is a real number larger than 1). The small lattices 18 have a smallest square shape. For example, the thin metal wire contains gold (Au), silver (Ag), or copper (Cu).

The two or more first large lattices 14A are arranged in an x direction (a first direction) with the first connections 16A disposed therebetween, to form a first conductive pattern 22A composed of the thin metal wire. Two or more of the first conductive patterns 22A are arranged in a y direction (a second direction) perpendicular to the x direction. Electrically isolated first insulations 24A are disposed between the adjacent first conductive patterns 22A.

More specifically, on the four sides of each first large lattice 14A, i.e., a first side 28a and a second side 28b which are adjacent to a corner 26a that is not connected to an adjacent first large lattice 14A, and a third side 28c and a fourth side 28d which are adjacent to another corner 26b that is not connected to an adjacent first large lattice 14A, the two or more rectangular shapes are arranged to form a rectangular wave shape. Particularly, in the first large lattice 14A, the rectangular shapes on the first side 28a are alternated with those on the fourth side 28d opposite to the first side 28a, and the rectangular shapes on the second side 28b are alternated with those on the third side 28c opposite to the second side 28b. The two or more small lattices 18 are arranged to form the rectangular wave shape of each of the sides of each first large lattice 14A.

In the first connection 16A, the four medium lattices 20 (the first medium lattice 20a to the fourth medium lattice 20d) are arranged in a zigzag manner, and each of the medium lattices 20 has a size equal to the total size of four small lattices 18. The first medium lattice 20a is disposed at the boundary between the second side 28b and the fourth side 28d, and forms an L-shaped space in combination with one small lattice 18. The second medium lattice 20b is disposed on one side of the first medium lattice 20a (the straight line 30 along the second side 28b), and forms a square space. Thus, the shape of the second medium lattice 20b is such that four small lattices 18 are arranged in a matrix and the central cross is removed. The third medium lattice 20c is adjacent to the first medium lattice 20a and the second medium lattice 20b, and has the same shape as the second medium lattice 20b. The fourth medium lattice 20d is disposed at the boundary between the third side 28c and the first side 28a, is adjacent to the second medium lattice 20b and the third medium lattice 20c, and forms an L-shaped space in combination with one small lattice 18 as well as the first medium lattice 20a. In a case where the small lattices 18 have an arrangement pitch Ps, and the medium lattices 20 have an arrangement pitch Pm of 2×Ps.

As described above, in the first conductive sheet 10A, the two or more first large lattices 14A are arranged in the x direction with the first connections 16A disposed therebetween to form one first conductive pattern 22A, the two or more small lattices 18 are combined to form each first large lattice 14A. In each first large lattice 14A, the shapes of the sides thereof that are opposite to each other are alternated. As a result, the first conductive sheet 10A can exhibit a significantly lowered electrical resistance as compared with structures using one ITO film for one electrode. Thus, if the first conductive sheet 10A is used in a projected capacitive touch panel or the like, the response speed and the size of the touch panel can be easily increased.

A pair of touch panel conductive sheets, which use the first conductive sheet 10A described above, i.e., a touch panel conductive sheet 50 according to the present embodiment, will be described below with reference to FIGS. 3 through 6.

Figure 3:
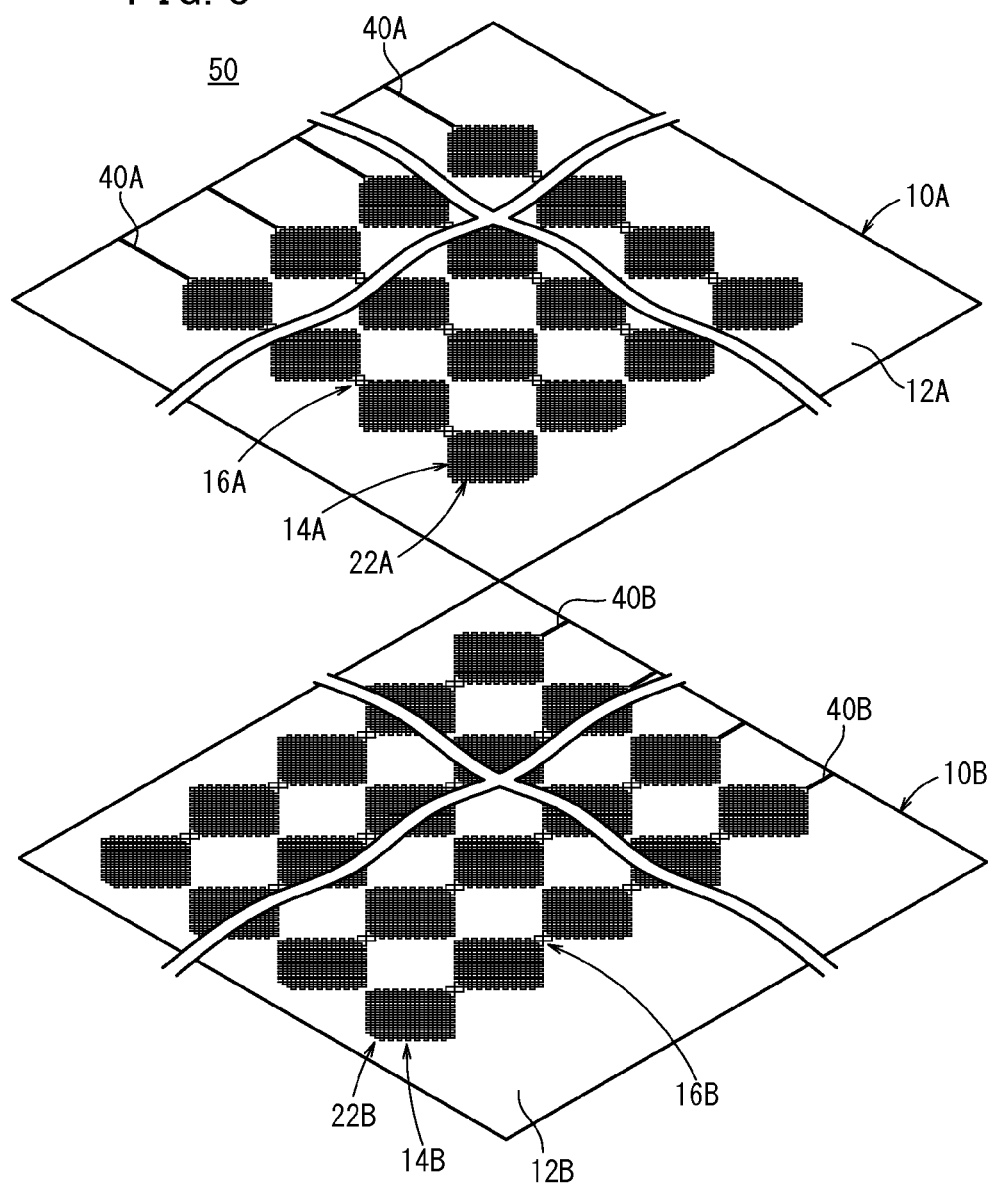
FIG. 3 is an exploded perspective view partially showing a touch panel conductive sheet.
Figure 4A:
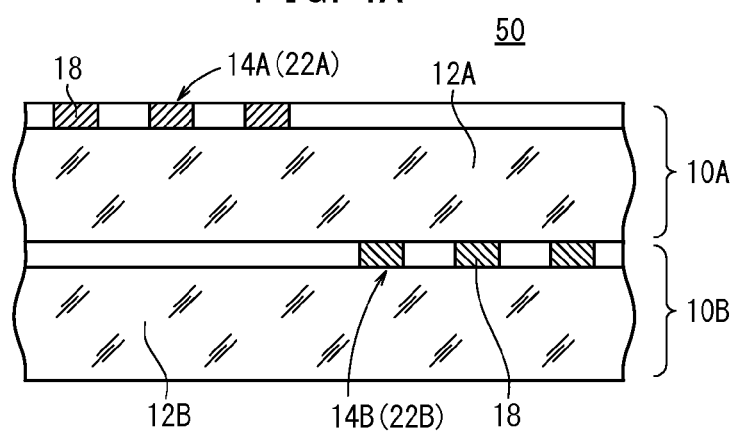
FIG. 4A is a cross-sectional view partially showing an example of the touch panel conductive sheet.

As shown in FIGS. 3 and 4A, the touch panel conductive sheet 50 is obtained by stacking the first conductive sheet 10A and a second conductive sheet 10B to be hereinafter described.

The first conductive sheet 10A has been described above and will not be described repeatedly in detail. As shown in FIG. 3, however, in one end of each first conductive pattern 22A, the first connection 16A is not formed on the open end of the first large lattice 14A. In the other end of the first conductive pattern 22A, the end of the first large lattice 14A is electrically connected to a first external wiring 40A.

Figure 5:
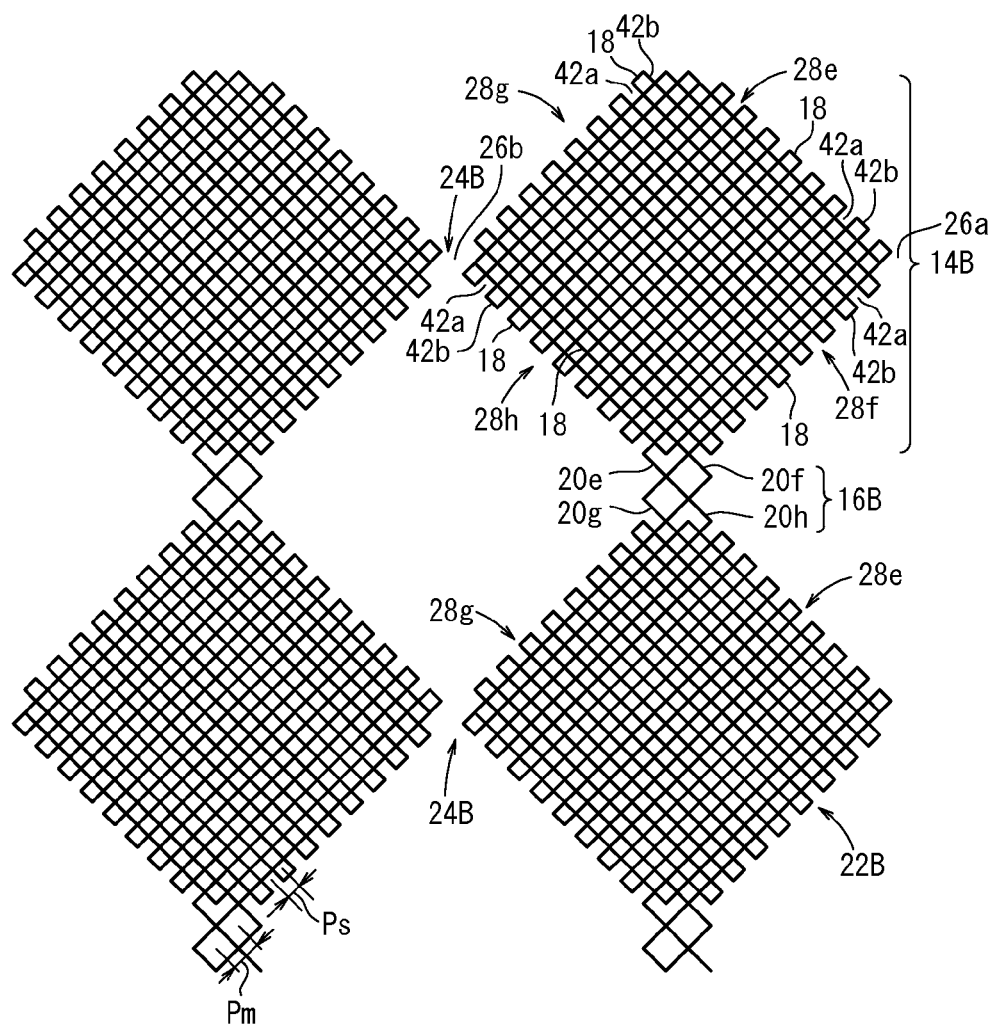
FIG. 5 is a plan view showing an example of a second conductive pattern formed on a second conductive sheet.

As shown in FIGS. 3 and 4A, the second conductive sheet 10B has two or more conductive second large lattices 14B composed of a thin metal wire formed on one main surface of a second transparent substrate 12B. As shown in FIG. 5, each of the second large lattices 14B comprises a combination of two or more small lattices 18. The second large lattices 14B each have the sides that are opposite to each other, and the shapes of the sides are alternated. Second connections 16B composed of a thin metal wire are disposed between adjacent ones of the second large lattices 14B and electrically connect these adjacent second large lattices 14B to each other. The second connections 16B each contain one or more medium lattices 20, and the pitch of the medium lattices 20 is n times large than that of the small lattices 18 (in which n is a real number larger than 1).

The two or more second large lattices 14B are arranged in the y direction (the second direction) with the second connections 16B disposed therebetween, to form one second conductive pattern 22B. Two or more of the second conductive patterns 22B are arranged in the x direction (the first direction) perpendicular to the y direction. Electrically isolated second insulations 24B are disposed between the adjacent second conductive patterns 22B.

More specifically, on the four sides of each second large lattice 14B, i.e., a fifth side 28e and a sixth side 28f which are adjacent to a corner 26a that is not connected to an adjacent second large lattice 14B, and a seventh side 28g and an eighth side 28h which are adjacent to another corner 26b that is not connected to an adjacent second large lattice 14B, the two or more rectangular shapes are arranged to form the rectangular wave shape. Particularly, in the second large lattice 14B, the rectangular shapes on the fifth side 28e are alternated with those on the eighth side 28h opposite to the fifth side 28e, and the rectangular shapes on the sixth side 28f are alternated with those on the seventh side 28g opposite to the sixth side 28f.

In the second connection 16B, the four medium lattices (the fifth medium lattice 20e to the eighth medium lattice 20h) are arranged in a zigzag manner, and each of the medium lattices 20 has a size equal to the total size of four small lattices 18. The fifth medium lattice 20e is disposed at the boundary between the sixth side 28f and the eighth side 28h, and forms an L-shaped space in combination with one small lattice 18. The sixth medium lattice 20f is disposed on one side of the fifth medium lattice 20e (the second straight line 30 along the sixth side 28f), and forms a square space. Thus, the shape of the sixth medium lattice 20f is such that four small lattices 18 are arranged in a matrix and the central cross is removed. The seventh medium lattice 20g is adjacent to the fifth medium lattice 20e and the sixth medium lattice 20f, and has the same shape as the sixth medium lattice 20f. The eighth medium lattice 20h is disposed at the boundary between the seventh side 28g and the fifth side 28e, is adjacent to the sixth medium lattice 20f and the seventh medium lattice 20g, and forms an L-shaped space in combination with one small lattice 18 as the fifth medium lattice 20e. Also in the second conductive sheet 10B, in a case where the small lattices 18 have an arrangement pitch Ps, the medium lattices 20 have an arrangement pitch Pm of 2×Ps.

As shown in FIG. 3, in one end of each second conductive pattern 22B, the second connection 16B is not formed on the open end of the second large lattice 14B. In the other end of the second conductive pattern 22B, the end of the second large lattice 14B is electrically connected to a second external wiring 40B.

Figure 6:
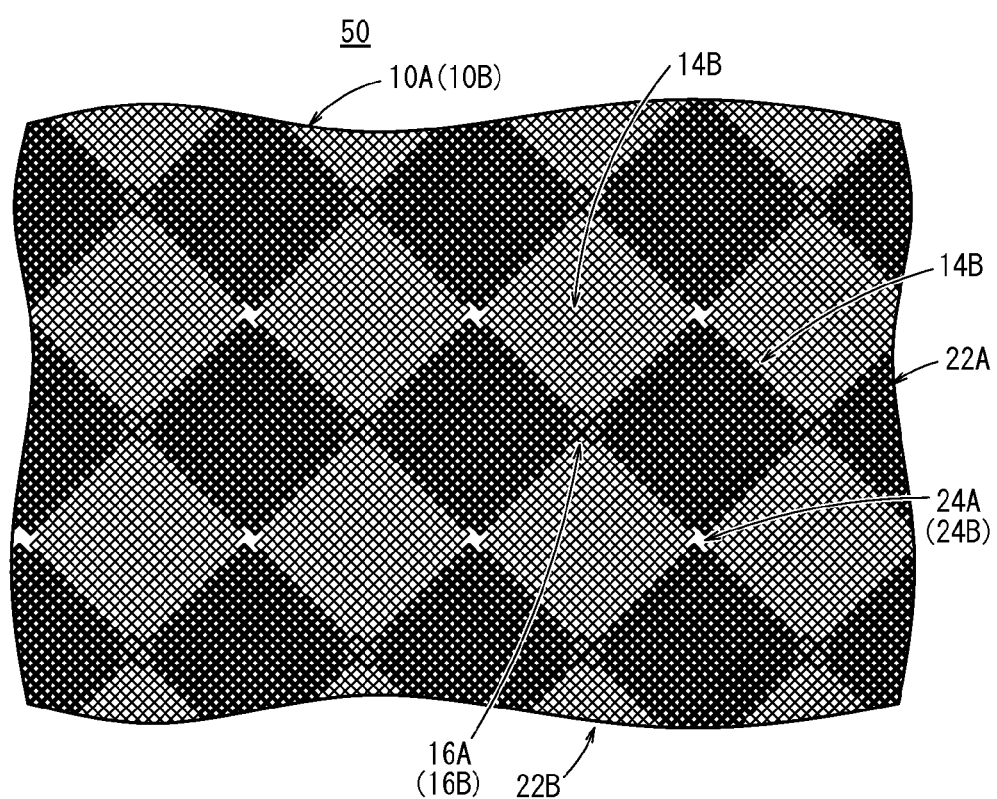
FIG. 6 is a plan view partially showing an example of the touch panel conductive sheet obtained by combining the first and second conductive sheets.

For example, as shown in FIG. 6, in a case where the first conductive sheet 10A is stacked on the second conductive sheet 10B to form the touch panel conductive sheet 50, the first connections 16A of the first conductive patterns 22A and the second connections 16B of the second conductive patterns 22B are arranged facing each other with the first transparent substrate 12A (see FIG. 4A) in between. Also, the first insulations 24A between the first conductive patterns 22A and the second insulations 24B between the second conductive patterns 22B are arranged facing each other with the first transparent substrate 12A in between. Though the first conductive patterns 22A and the second conductive patterns 22B are exaggeratingly shown by thick lines and thin lines respectively to clearly represent the positions thereof in FIG. 6, they have the same line width.

In a case where the stacked first conductive sheet 10A and second conductive sheet 10B are observed from above, the spaces between the first large lattices 14A of the first conductive sheet 10A are filled with the second large lattices 14B of the second conductive sheet 10B. In this observation, the openings of recesses 42a of the rectangular wave shapes on the first sides 28a and the second sides 28b of the first large lattices 14A are connected to the distal end portions of protrusions 42b of the rectangular wave shapes on the sixth sides 28f and the eighth sides 28h of the second large lattices 14B, so that the small lattices 18 are arranged over the stack contiguously. Similarly, the openings of recesses 42a of the rectangular wave shapes on the third sides 28c and the fourth sides 28d of the first large lattices 14A are connected to the distal end portions of protrusions 42b of the rectangular wave shapes on the fifth sides 28e and the seventh sides 28g of the second large lattices 14B, so that the small lattices 18 are arranged over the stack contiguously. As a result, the boundaries between the first large lattices 14A and the second large lattices 14B cannot be easily found. In the rectangular wave shapes, the openings of recesses 42a overlap with the distal end portions of protrusions 42b as described above, whereby the boundaries between the first large lattices 14A and the second large lattices 14B are made less visible to improve the visibility. Though an opening having a cross shape is formed in each overlap of the first insulation 24A and the second insulation 24B, the opening does not block a light and is less visible unlike the above thickened line.

In a case where the overlaps of the first connections 16A and the second connections 16B are observed from above, the connection point of the fifth medium lattice 20e and the seventh medium lattice 20g in the second connection 16B is positioned approximately at the center of the second medium lattice 20b in the first connection 16A, the connection point of the sixth medium lattice 20f and the eighth medium lattice 20h in the second connection 16B is positioned approximately at the center of the third medium lattice 20c in the first connection 16A, and the first medium lattices 20a to the eighth medium lattices 20h form a plurality of the small lattices 18 in combination. Therefore, the plural small lattices 18 are formed by the combination of the first connections 16A and the second connections 16B in the overlaps. Thus formed small lattices 18 cannot be distinguished from the surrounding small lattices 18 in the first large lattices 14A and the second large lattices 14B, so that the visibility is improved.

In a case where the touch panel conductive sheet 50 is used in a touch panel, a protective layer is formed on the first conductive sheet 10A. Furthermore, the first external wiring 40A extending from a large number of the first conductive patterns 22A in the first conductive sheet 10A and the second external wiring 40B extending from a large number of the second conductive patterns 22B in the second conductive sheet 10B are connected to an IC circuit for position calculation or the like.

In a case where a finger comes into contact with the protective layer, signals are transmitted from the first conductive pattern 22A and the second conductive pattern 22B facing the finger touch position to the IC circuit. The finger touch position is calculated in the IC circuit based on the transmitted signals. Thus, even if two fingers come into contact with the protective layer simultaneously, each of the finger touch positions can be detected.

As described above, in a case where the touch panel conductive sheet 50 is used, e.g., in a projected capacitive touch panel or the like, the response speed and the size of the touch panel can be easily increased. Furthermore, the boundaries between the first large lattices 14A of the first conductive sheet 10A and the second large lattices 14B of the second conductive sheet 10B are less visible, and the first connections 16A and the second connections 16B form the plural small lattices 18 in combination, so that defects such as local line thickening can be prevented, and the overall visibility can be improved.

In the touch panel conductive sheet 50, the four sides (the first side 28a to the fourth side 28d) of the first large lattice 14A and the four sides (the fifth side 28e to the eighth side 28h) of the second large lattice 14B have the equivalent rectangular wave shapes, whereby charge localization in the ends of the first large lattices 14A and the second large lattices 14B can be reduced to prevent false finger position detection.

Though the arrangement pitch Pm of the medium lattices 20 in the first connections 16A and the second connections 16B is twice larger than the arrangement pitch Ps of the small lattices 18 in the first conductive sheet 10A and the second conductive sheet 10B of the above embodiments, the pitch Pm may be appropriately selected depending on the number of the medium lattices 20. For example, the pitch Pm may be 1.5 or 3 times larger than the pitch Ps. If the pitch Pm of the medium lattices 20 is excessively small or large, it may be difficult to arrange the large lattices 14, resulting in poor appearance. Thus, the pitch Pm is preferably 1 to 10 times, more preferably 1 to 5 times, larger than the pitch Ps of the small lattices 18.

Also, the sizes of the small lattices 18 (including the side length and the diagonal line length), the number of the small lattices 18 in the first large lattice 14A, and the number of the small lattices 18 in the second large lattice 14B may be appropriately selected depending on the size and the resolution (the line number) of the touch panel.

Figure 4B:
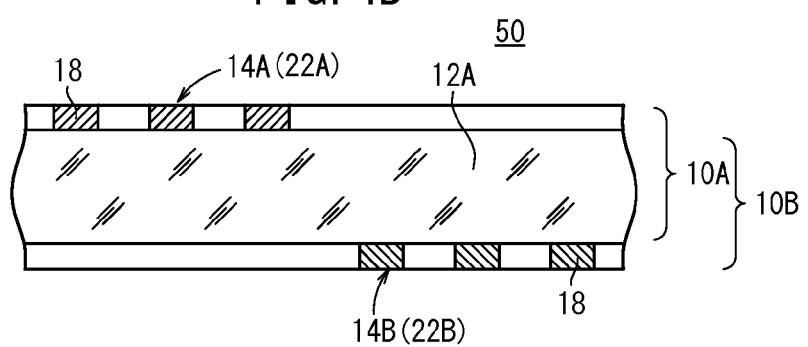
FIG. 4B is a cross-sectional view partially showing another example of the touch panel conductive sheet.

As shown in FIGS. 3 and 4A, in the above touch panel conductive sheet 50, the first conductive patterns 22A are formed on the one main surface of the first transparent substrate 12A, and the second conductive patterns 22B are formed on the one main surface of the second transparent substrate 12B. Alternatively, as shown in FIG. 4B, the structure of the touch panel conductive sheet 50 may be such that the first conductive patterns 22A are formed on one main surface of the first transparent substrate 12A and the second conductive patterns 22B are formed on the other main surface of the first transparent substrate 12A. In addition, another layer may be formed between the first conductive sheet 10A and the second conductive sheet 10B. The first conductive pattern 22A and the second conductive pattern 22B may be arranged facing each other as long as they are insulated.

The first conductive sheet 10A and the second conductive sheet 10B may be produced as follows. For example, a photosensitive material having the first transparent substrate 12A or the second transparent substrate 12B and thereon a photosensitive silver halide-containing emulsion layer may be exposed and developed, whereby metallic silver portions and light-transmitting portions may be formed in the exposed areas and the unexposed areas respectively to obtain the first conductive patterns 22A or the second conductive patterns 22B. The metallic silver portions may be subjected to a physical development treatment and/or a plating treatment to deposit a conductive metal thereon.

As shown in FIG. 4B, the first conductive patterns 22A may be formed on one main surface of the first transparent substrate 12A, and the second conductive patterns 22B may be formed on the other main surface thereof. In this case, if the one main surface is exposed and then the other main surface is exposed in the usual method, the desired first conductive patterns 22A and second conductive patterns 22B cannot be obtained occasionally. In particular, it is difficult to uniformly form the pattern wherein the rectangular wave shapes project from the sides or the first large lattices 14A and second large lattices 14B.

Therefore, the following production method can be preferably used.

Thus, the first conductive patterns 22A on the one main surface of the first transparent substrate 12A and the second conductive patterns 22B on the other main surface of the first transparent substrate 12A are formed by subjecting the photosensitive silver halide emulsion layers on both sides of the first transparent substrate 12A to one-shot exposure.

A specific example of the production method will be described below with reference to FIGS. 7 to 9.

Figure 8A:
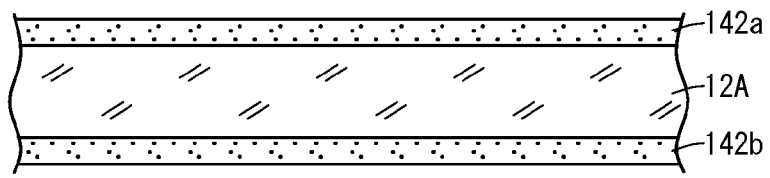
FIG. 8A is a cross-sectional view partially showing a produced photosensitive material.

First, in the step S1 of FIG. 7, a long photosensitive material 140 is prepared. As shown in FIG. 8A, the photosensitive material 140 has the first transparent substrate 12A, a photosensitive silver halide emulsion layer (hereinafter referred to as a first photosensitive layer 142a) formed on one main surface of the first transparent substrate 12A, and a photosensitive silver halide emulsion layer (hereinafter referred to as a second photosensitive layer 142b) formed on the other main surface of the first transparent substrate 12A.

Figure 8B:
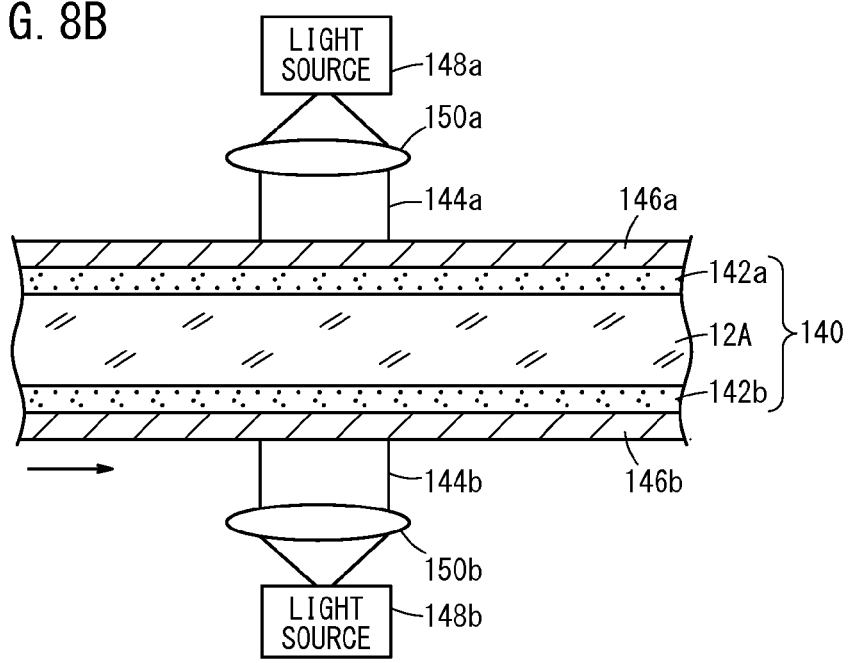
FIG. 8B is an explanatory view showing a simultaneous both-side exposure of the photosensitive material.

In the step S2 of FIG. 7, the photosensitive material 140 is exposed. In this step, a simultaneous both-side exposure, which includes a first exposure treatment for irradiating the first photosensitive layer 142a on the first transparent substrate 12A with a light in a first exposure pattern and a second exposure treatment for irradiating the second photosensitive layer 142b on the first transparent substrate 12A with a light in a second exposure pattern, is carried out. In the example of FIG. 8B, the first photosensitive layer 142a is irradiated through a first photomask 146a with a first light 144a (a parallel light), and the second photosensitive layer 142b is irradiated through a second photomask 146b with a second light 144b (a parallel light), while conveying the long photosensitive material 140 in one direction. The first light 144a is such that a light from a first light source 148a is converted to a parallel light by an intermediate first collimator lens 150a, and the second light 144b is such that a light from a second light source 148b is converted to a parallel light by an intermediate second collimator lens 150b. Though two light sources (the first light source 148a and the second light source 148b) are used in the example of FIG. 8B, only one light source may be used. In this case, a light from the one light source may be divided by an optical system into the first light 144a and the second light 144b for exposing the first photosensitive layer 142a and the second photosensitive layer 142b.

In the step S3 of FIG. 7, the exposed photosensitive material 140 is developed to prepare the touch panel conductive sheet 50 shown in FIG. 4B. The touch panel conductive sheet 50 has the first transparent substrate 12A, the first conductive patterns 22A formed in the first exposure pattern on the one main surface of the first transparent substrate 12A, and the second conductive patterns 22B formed in the second exposure pattern on the other main surface of the first transparent substrate 12A. Preferred exposure time and development time for the first photosensitive layer 142a and the second photosensitive layer 142b depend on the types of the first light source 148a, the second light source 148b, and a developer, etc., and cannot be categorically determined. The exposure time and development time may be selected in view of achieving a development ratio of 100%.

Figure 9:
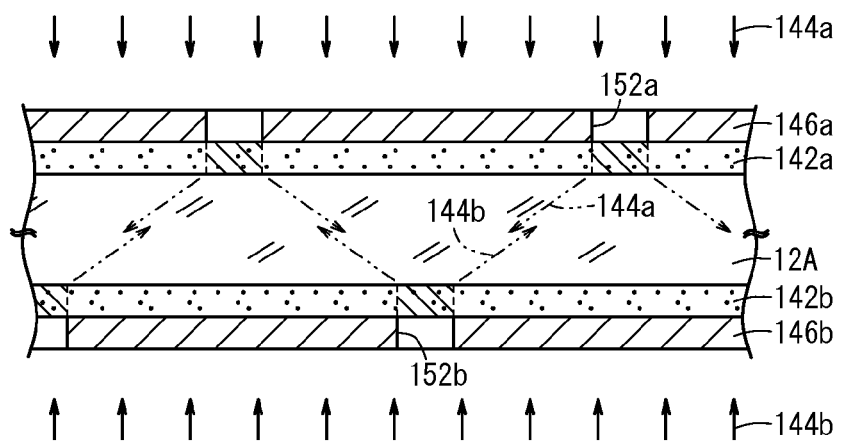
FIG. 9 is an explanatory view showing first and second exposure treatments performed while preventing a light incident on a first photosensitive layer to a second photosensitive layer and a light incident on the second photosensitive layer to the first photosensitive layer from being transmitted.

As shown in FIG. 9, in the first exposure treatment in the production method of this embodiment, for example, the first photomask 146a is placed in close contact with the first photosensitive layer 142a, the first light source 148a is arranged facing the first photomask 146a, and the first light 144a is emitted from the first light source 148a toward the first photomask 146a, so that the first photosensitive layer 142a is exposed. The first photomask 146a has a glass substrate composed of a transparent soda glass and a mask pattern (a first exposure pattern 152a) formed thereon. Therefore, in the first exposure treatment, areas in the first photosensitive layer 142a, corresponding to the first exposure pattern 152a in the first photomask 146a, are exposed. A space of approximately 2 to 10 μm may be formed between the first photosensitive layer 142a and the first photomask 146a.

Similarly, in the second exposure treatment, for example, the second photomask 146b is placed in close contact with the second photosensitive layer 142b, the second light source 148b is arranged facing the second photomask 146b, and the second light 144b is emitted from the second light source 148b toward the second photomask 146b, so that the second photosensitive layer 142b is exposed. The second photomask 146b, as well as the first photomask 146a, has a glass substrate composed of a transparent soda glass and a mask pattern (a second exposure pattern 152b) formed thereon. Therefore, in the second exposure treatment, areas in the second photosensitive layer 142b, corresponding to the second exposure pattern 152b in the second photomask 146b, are exposed. In this case, a space of approximately 2 to 10 μm may be formed between the second photosensitive layer 142b and the second photomask 146b.

In the first and second exposure treatments, the emission of the first light 144a from the first light source 148a and the emission of the second light 144b from the second light source 148b may be carried out simultaneously or independently. In a case where the emissions are simultaneously carried out, the first photosensitive layer 142a and the second photosensitive layer 142b can be simultaneously exposed in one exposure process to reduce the treatment time.

In a case where both of the first photosensitive layer 142a and the second photosensitive layer 142b are not spectrally sensitized, a light incident on one side may affect the image formation on the other side (the back side) in the both-side exposure of the photosensitive material 140.

Thus, the first light 144a from the first light source 148a reaches the first photosensitive layer 142a and is scattered by silver halide particles in the first photosensitive layer 142a, and a part of the scattered light is transmitted through the first transparent substrate 12A and reaches the second photosensitive layer 142b. Then, a large area of the boundary between the second photosensitive layer 142b and the first transparent substrate 12A is exposed to form a latent image. As a result, the second photosensitive layer 142b is exposed to the second light 144b from the second light source 148b and the first light 144a from the first light source 148a. If the second photosensitive layer 142b is developed to prepare the touch panel conductive sheet 50, the conductive pattern corresponding to the second exposure pattern 152b (the second conductive pattern 22B) is formed, and additionally a thin conductive layer is formed due to the first light 144a from the first light source 148a between the conductive patterns, so that the desired pattern (corresponding to the second exposure pattern 152b) cannot be obtained. This is true also for the first photosensitive layer 142a.

As a result of intense research in view of solving this problem, it has been found that if the thicknesses and the applied silver amounts of the first photosensitive layer 142a and the second photosensitive layer 142b are selected within particular ranges, the incident light can be absorbed by the silver halide to suppress the light transmission to the back side. In this embodiment, the thicknesses of the first photosensitive layer 142a and the second photosensitive layer 142b may be 1 to 4 μm. The upper limit is preferably 2.5 μm. The applied silver amounts of the first photosensitive layer 142a and the second photosensitive layer 142b may be 5 to 20 g/m².

In the above described both-side contact exposure technology, the exposure may be inhibited by dust or the like attached to the film surface to generate an image defect. It is known that the dust attachment can be prevented by applying a conductive substance such as a metal oxide or a conductive polymer to the film. However, the metal oxide or the like remains in the processed product, deteriorating the transparency of the final product, and the conductive polymer is disadvantageous in storage stability, etc. As a result of intense research, it has been found that a silver halide layer with reduced binder content exhibits a satisfactory conductivity for static charge prevention. Thus, the volume ratio of silver/binder is limited in the first photosensitive layer 142a and the second photosensitive layer 142b. The silver/binder volume ratios of the first photosensitive layer 142a and the second photosensitive layer 142b are 1/1 or more, preferably 2/1 or more.

If the thicknesses, the applied silver amounts, and the silver/binder volume ratios of the first photosensitive layer 142a and the second photosensitive layer 142b are selected as described above, the first light 144a emitted from the first light source 148a to the first photosensitive layer 142a does not reach the second photosensitive layer 142b as shown in FIG. 9. Similarly, the second light 144b emitted from the second light source 148b to the second photosensitive layer 142b does not reach the first photosensitive layer 142a. As a result, in the following development for producing the touch panel conductive sheet 50, as shown in FIG. 4B, only the conductive pattern corresponding to the first exposure pattern 152a (the first conductive pattern 22A etc.) is formed on the one main surface of the first transparent substrate 12A, and only the conductive pattern corresponding to the second exposure pattern 152b (the second conductive pattern 22B etc.) is formed on the other main surface of the first transparent substrate 12A, so that the desired pattern can be obtained.

In the production method using the above one-shot both-side exposure, the first photosensitive layer 142a and the second photosensitive layer 142b can have both of the satisfactory conductivity and both-side exposure suitability, and the same or different patterns can be formed on the sides of the first transparent substrate 12A by one exposure treatment, whereby the electrodes of the touch panel can be easily formed, and the touch panel can be made thinner (smaller).

In the above production method, the first conductive patterns 22A and the second conductive patterns 22B are formed using the photosensitive silver halide emulsion layer. The other production methods include the following methods.

That is, photoresist films on copper foils formed on the first transparent substrate 12A and the second transparent substrate 12B may be exposed and developed to form a resist pattern, and the copper foil exposed from the resist pattern may be etched to obtain the first conductive patterns 22A and the second conductive patterns 22B.

Alternatively, paste containing fine metal particles may be printed on the first transparent substrate 12A and the second transparent substrate 12B, and the printed paste may be plated with a metal to obtain the first conductive patterns 22A and the second conductive patterns 22B.

The first conductive patterns 22A and the second conductive patterns 22B may be printed on the first transparent substrate 12A and the second transparent substrate 12B by using a screen or gravure printing plate.

A particularly preferred method, which contains using a photographic photosensitive silver halide material for producing the first conductive sheet 10A and the second conductive sheet 10B according to an embodiment of the present invention, will be mainly described below.

The method for producing the first conductive sheet 10A and the second conductive sheet 10B of this embodiment includes the following three processes, depending on the photosensitive materials and development treatments.

(1) A process comprising subjecting a photosensitive black-and-white silver halide material free of physical development nuclei to a chemical or thermal development, to form the metallic silver portions on the photosensitive material.

(2) A process comprising subjecting a photosensitive black-and-white silver halide material having a silver halide emulsion layer containing physical development nuclei to a solution physical development, to form the metallic silver portions on the photosensitive material.

(3) A process comprising subjecting a stack of a photosensitive black-and-white silver halide material free of physical development nuclei and an image-receiving sheet having a non-photosensitive layer containing physical development nuclei to a diffusion transfer development, to form the metallic silver portions on the non-photosensitive image-receiving sheet.

In the process of (1), an integral black-and-white development procedure is used to form a transmittable conductive film such as a light-transmitting conductive film on the photosensitive material. The resulting silver is a chemically or thermally developed silver containing a high-specific surface area filament, and thereby shows a high activity in the following plating or physical development treatment.

In the process of (2), the silver halide particles are melted around the physical development nuclei and deposited on the nuclei in the exposed areas to form a transmittable conductive film such as a light-transmitting conductive film on the photosensitive material. Also in this process, an integral black-and-white development procedure is used. Though high activity can be achieved since the silver halide is deposited on the physical development nuclei in the development, the developed silver has a spherical shape with small specific surface.

In the process of (3), the silver halide particles are melted in the unexposed areas, and diffused and deposited on the development nuclei of the image-receiving sheet, to form a transmittable conductive film such as a light-transmitting conductive film on the sheet. In this process, a so-called separate-type procedure is used, and the image-receiving sheet is peeled off from the photosensitive material.

A negative or reversal development treatment can be used in the processes. In the diffusion transfer development, the negative development treatment can be carried out using an auto-positive photosensitive material.

The chemical development, thermal development, solution physical development, and diffusion transfer development have the meanings generally known in the art, and are explained in common photographic chemistry texts such as Shin-ichi Kikuchi, "*Shashin Kagaku (Photographic Chemistry)*", Kyoritsu Shuppan Co., Ltd., 1955 and C. E. K. Mees, "*The Theory of Photographic Processes, 4th ed.*", Mcmillan, 1977. A liquid treatment is generally used in the present invention, and also a thermal development treatment can be utilized. For example, techniques described in Japanese Laid-Open Patent Publication Nos. 2004-184693, 2004-334077, and 2005-010752, and Japanese Patent Application Nos. 2004-244080 and 2004-085655 can be used in the present invention.

The structure of each layer in the first conductive sheet 10A and the second conductive sheet 10B of this embodiment will be described in detail below.

[First Transparent Substrate 12A and Second Transparent Substrate 12B]

The first transparent substrate 12A and the second transparent substrate 12B may be a plastic film, a plastic plate, a glass plate, etc.

Examples of materials for the plastic film and the plastic plate include polyesters such as polyethylene terephthalates (PET) and polyethylene naphthalates (PEN); polyolefins such as polyethylenes (PE), polypropylenes (PP), polystyrenes, and EVA; vinyl resins; polycarbonates (PC); polyamides; polyimides; acrylic resins; and triacetyl celluloses (TAC).

The first transparent substrate 12A and the second transparent substrate 12B are preferably a film or plate of a plastic having a melting point of about 290° C. or lower, such as PET (melting point 258° C.), PEN (melting point 269° C.), PE (melting point 135° C.), PP (melting point 163° C.), polystyrene (melting point 230° C.), polyvinyl chloride (melting point 180° C.), polyvinylidene chloride (melting point 212° C.), or TAC (melting point 290° C.). The PET is particularly preferred from the viewpoints of light transmittance, workability, etc. The transparent conductive film such as the first conductive sheet 10A and the second conductive sheet 10B used in the touch panel conductive sheet 50 is required to be transparent, and therefore the first transparent substrate 12A and the second transparent substrate 12B preferably have a high transparency.

[Silver Salt Emulsion Layer]

The silver salt emulsion layer to be converted to the conductive layer in the first conductive sheet 10A and the second conductive sheet 10B (the conductive portions including the first large lattices 14A, the first connections 16A, the second large lattices 14B, the second connections 16B, and the small lattices 18) contains a silver salt and a binder, and may contain a solvent and an additive such as a dye in addition thereto.

The silver salt used in this embodiment may be an inorganic silver salt such as a silver halide or an organic silver salt such as silver acetate. In this embodiment, the silver halide is preferred because of its excellent light sensing property.

The applied silver amount (the amount of the applied silver salt in the silver density) of the silver salt emulsion layer is preferably 1 to 30 $g/m^2$, more preferably 1 to 25 $g/m^2$, further preferably 5 to 20 $g/m^2$. In a case where the applied silver amount is within this range, the resultant first conductive sheet 10A or second conductive sheet 10B can exhibit a desired surface resistance.

Examples of the binders used in this embodiment include gelatins, polyvinyl alcohols (PVA), polyvinyl pyrolidones (PVP), polysaccharides such as starches, celluloses and derivatives thereof, polyethylene oxides, polyvinylamines, chitosans, polylysines, polyacrylic acids, polyalginic acids, polyhyaluronic acids, and carboxycelluloses. The binders show a neutral, anionic, or cationic property depending on the ionicity of a functional group.

In this embodiment, the amount of the binder in the silver salt emulsion layer is not particularly limited, and may be appropriately selected to obtain sufficient dispersion and adhesion properties. The volume ratio of silver/binder in the silver salt emulsion layer is preferably 1/4 or more, more preferably 1/2 or more. Furthermore, the silver/binder volume ratio is preferably 100/1 or less, more preferably 50/1 or less. Particularly, the silver/binder volume ratio is further preferably 1/1 to 4/1, most preferably 1/1 to 3/1. If the silver/binder volume ratio of the silver salt emulsion layer is within the range, the resistance variation can be reduced even under various applied silver amount. Thus, the first conductive sheet 10A or the second conductive sheet 10B can be produced with a uniform surface resistance. The silver/binder volume ratio can be obtained by converting the silver halide/binder weight ratio of the material to the silver/binder weight ratio, and by further converting the silver/binder weight ratio to the silver/binder volume ratio.

<Solvent>

The solvent used for forming the silver salt emulsion layer is not particularly limited, and Examples thereof include water, organic solvents (e.g. alcohols such as methanol, ketones such as acetone, amides such as formamide, sulfoxides such as dimethyl sulfoxide, esters such as ethyl acetate, ethers), ionic liquids, and mixtures thereof.

In this embodiment, the ratio of the solvent to the total of the silver salt, the binder, and the like in the silver salt emulsion layer is 30% to 90% by mass, preferably 50% to 80% by mass.

<Other Additives>

The additives used in this embodiment are not particularly limited, and may be preferably selected from known additives.

[Other Layers]

A protective layer (not shown) may be formed on the silver salt emulsion layer. The protective layer used in this embodiment contains a binder such as a gelatin or a high-molecular polymer, and is disposed on the photosensitive silver salt emulsion layer to improve the scratch prevention or mechanical property. The thickness of the protective layer is preferably 0.5 µm or less. The method of applying or forming the protective layer is not particularly limited, and may be appropriately selected from known applying or forming methods. In addition, an undercoat layer or the like may be formed below the silver salt emulsion layer.

The steps for producing the first conductive sheet 10A and the second conductive sheet 10B will be described below.

[Exposure]

In this embodiment, the first conductive patterns 22A and the second conductive patterns 22B may be formed in a printing process, and they may be formed by exposure and development treatments, etc. in another process. Thus, a photosensitive material having the first transparent substrate 12A and the second transparent substrate 12B and thereon the silver salt-containing layer or a photosensitive material coated with a photopolymer for photolithography is subjected to the exposure treatment. An electromagnetic wave may be used in the exposure. For example, the electromagnetic wave may be a light such as a visible light or an ultraviolet light, or a radiation ray such as an X-ray. The exposure may be carried out using a light source having a wavelength distribution or a specific wavelength.

[Development Treatment]

In this embodiment, the emulsion layer is subjected to the development treatment after the exposure. Common development treatment technologies for photographic silver salt films, photographic papers, print engraving films, emulsion masks for photomasking, and the like may be used in the present invention. The developer used in the development treatment is not particularly limited, and may be a PQ developer, an MQ developer, an MAA developer, etc. Examples of commercially available developers usable in the present invention include CN-16, CR-56, CP45X, FD-3, and PAPITOL available from FUJIFILM Corporation, C-41, E-6, RA-4, D-19, and D-72 available from Eastman Kodak Company, and developers contained in kits thereof. The developer may be a lith developer.

In the present invention, the development process may include a fixation treatment for removing the silver salt in the unexposed areas to stabilize the material. Fixation treatment technologies for photographic silver salt films, photographic papers, print engraving films, emulsion masks for photomasking, and the like may be used in the present invention.

In the fixation treatment, the fixation temperature is preferably about 20° C. to 50° C., more preferably 25° C. to 45° C. The fixation time is preferably 5 seconds to 1 minute, more preferably 7 to 50 seconds. The amount of the fixer is preferably 600 ml/m$^2$ or less, more preferably 500 ml/m$^2$ or less, particularly preferably 300 ml/m$^2$ or less, per 1 m$^2$ of the photosensitive material treated.

The developed and fixed photosensitive material is preferably subjected to a water washing treatment or a stabilization treatment. The amount of water used in the water washing or stabilization treatment is generally 20 L or less, and may be 3 L or less, per 1 m$^2$ of the photosensitive material. The water amount may be 0, and thus the photosensitive material may be washed with storage water.

The ratio of the metallic silver contained in the exposed areas after the development to the silver contained in the areas before the exposure is preferably 50% or more, more preferably 80% or more by mass. In a case where the ratio is 50% or more by mass, a high conductivity can be achieved.

In this embodiment, the tone (gradation) obtained by the development is preferably more than 4.0, though not particularly restrictive. In a case where the tone is more than 4.0 after the development, the conductivity of the conductive metal portion can be increased while maintaining the high transmittance of the light-transmitting portion. For example, the tone of 4.0 or more can be obtained by doping with rhodium or iridium ion.

The conductive sheet is obtained by the above steps. The surface resistance of the resultant conductive sheet is preferably within the range of 0.1 to 100 ohm/sq. The lower limit is preferably 1 ohm/sq, or more preferably 10 ohm/sq. The upper limit is preferably 70 ohm/sq, or more preferably 50 ohm/sq. The conductive sheet may be subjected to a calender treatment after the development treatment to obtain a desired surface resistance.

[Physical Development Treatment and Plating Treatment]

In this embodiment, to increase the conductivity of the metallic silver portion formed by the above exposure and development treatments, conductive metal particles may be deposited thereon by a physical development treatment and/or a plating treatment. In the present invention, the conductive metal particles may be deposited on the metallic silver portion by only one of the physical development and plating treatments or by the combination of the treatments. The metallic silver portion, subjected to the physical development treatment and/or the plating treatment in this manner, is also referred to as the conductive metal portion.

In this embodiment, the physical development is such a process that metal ions such as silver ions are reduced by a reducing agent, whereby metal particles are deposited on a metal or metal compound core. Such physical development has been used in the fields of instant B & W film, instant slide film, printing plate production, etc., and the technologies can be used in the present invention.

The physical development may be carried out at the same time as the above development treatment after the exposure, and may be carried out after the development treatment separately.

In this embodiment, the plating treatment may contain electroless plating (such as chemical reduction plating or displacement plating), electrolytic plating, or a combination thereof. Known electroless plating technologies for printed circuit boards, etc. may be used in this embodiment. The electroless plating is preferably electroless copper plating.

[Oxidation Treatment]

In this embodiment, the metallic silver portion formed by the development treatment and the conductive metal portion formed by the physical development treatment and/or the plating treatment are preferably subjected to an oxidation treatment. For example, by the oxidation treatment, a small amount of a metal deposited on the light-transmitting portion can be removed, so that the transmittance of the light-transmitting portion can be increased to approximately 100%.

[Conductive Metal Portion]

In this embodiment, the lower limit of the line width of the conductive metal portion (the line width of the thin metal wire) is preferably 1 μm or more, 3 μm or more, 4 μm or more, or 5 μm or more, and the upper limit thereof is preferably 15 μm, 10 μm or less, 9 μm or less, or 8 μm or less. The line distance is preferably 30 to 500 more preferably 50 to 400 μm, most preferably 100 to 350 μm. The conductive metal portion may have a part with a line width of more than 200 μm for the purpose of ground connection, etc.

In this embodiment, the opening ratio of the conductive metal portion is preferably 85% or more, more preferably 90% or more, most preferably 95% or more, in view of the visible light transmittance. The opening ratio is the ratio of the light-transmitting portions other than the conductive portions including the first large lattices 14A, the first connections 16A, the second large lattices 14B, the second connections 16B, and the small lattices 18 to the whole. For example, a square lattice having a line width of 15 μm and a pitch of 300 μm has an opening ratio of 90%.

[Light-Transmitting Portion]

In this embodiment, the light-transmitting portion is a portion having light transmittance, other than the conductive metal portions in the first conductive sheet 10A and the second conductive sheet 10B. As described above, the transmittance of the light-transmitting portion, which is herein a minimum transmittance value in a wavelength region of 380 to 780 nm obtained neglecting the light absorption and reflection of the first transparent substrate 12A and the second transparent substrate 12B, is 90% or more, preferably 95% or more, more preferably 97% or more, further preferably 98% or more, most preferably 99% or more.

The exposure is preferably carried out using a glass mask method or a laser lithography exposure method.

[First Conductive Sheet 10A and Second Conductive Sheet 10B]

In the first conductive sheet 10A and the second conductive sheet 10B of this embodiment, the thicknesses of the first transparent substrate 12A and the second transparent substrate 12B are preferably 5 to 350 μm, more preferably 30 to 150 μm. In a case where the thicknesses are 5 to 350 μm, a desired visible light transmittance can be obtained, and the substrates can be easily handled.

The thickness of the metallic silver portion formed on the first transparent substrate 12A and the second transparent substrate 12B may be appropriately selected by controlling the thickness of the coating liquid for the silver salt-containing layer applied to the substrate. The thickness of the metallic silver portion may be selected within a range of 0.001 to 0.2 mm, and is preferably 30 μm or less, more preferably 20 μm or less, further preferably 0.01 to 9 μm, most preferably 0.05 to 5 μm. The metallic silver portion is preferably formed in a patterned shape. The metallic silver portion may have a monolayer structure or a multilayer structure containing two or more layers. In a case where the metallic silver portion has a patterned multilayer structure containing two or more layers, the layers may have different wavelength color sensitivities. In this case, different patterns can be formed in the layers by using exposure lights with different wavelengths.

For use in a touch panel, the conductive metal portion preferably has a smaller thickness. As the thickness is reduced, the viewing angle and visibility of the display panel are improved. Thus, the thickness of the layer of the conductive metal on the conductive metal portion is preferably less than 9 μm, more preferably 0.1 μm or more but less than 5 μm, further preferably 0.1 μm or more but less than 3 μm.

In this embodiment, the thickness of the metallic silver portion can be controlled by changing the coating thickness of the silver salt-containing layer, and the thickness of the conductive metal particle layer can be controlled in the physical development treatment and/or the plating treatment, whereby the first conductive sheet 10A and the second conductive sheet 10B having a thickness of less than 5 μm (preferably less than 3 μm) can be easily produced.

The plating or the like is not necessarily carried out in the method for producing the first conductive sheet 10A and the second conductive sheet 10B of this embodiment. This is because the desired surface resistance can be obtained by controlling the applied silver amount and the silver/binder volume ratio of the silver salt emulsion layer in the method. The calender treatment or the like may be carried out if necessary.

(Film Hardening Treatment After Development Treatment)

It is preferred that after the silver salt emulsion layer is developed, the resultant is immersed in a hardener and thus subjected to a film hardening treatment. Examples of the hardeners include boric acid, 2,3-dihydroxy-1,4-dioxane, and dialdehydes such as glutaraldehyde and adipaldehyde, described in Japanese Laid-Open Patent Publication No. 02-141279.

The present invention may be appropriately combined with technologies described in the following patent publications and international patent pamphlets shown in Tables 1 and 2. "Japanese Laid-Open Patent", "Publication No.", "Pamphlet No.", and the like are omitted.

TABLE 1

| | | | | |
|---|---|---|---|---|
| 2004-221564 | 2004-221565 | 2007-200922 | 2006-352073 | 2007-129205 |
| 2007-235115 | 2007-207987 | 2006-012935 | 2006-010795 | 2006-228469 |
| 2006-332459 | 2009-21153 | 2007-226215 | 2006-261315 | 2007-072171 |
| 2007-102200 | 2006-228473 | 2006-269795 | 2006-269795 | 2006-324203 |
| 2006-228478 | 2006-228836 | 2007-009326 | 2006-336090 | 2006-336099 |
| 2006-348351 | 2007-270321 | 2007-270322 | 2007-201378 | 2007-335729 |
| 2007-134439 | 2007-149760 | 2007-208133 | 2007-178915 | 2007-334325 |
| 2007-310091 | 2007-116137 | 2007-088219 | 2007-207883 | 2007-013130 |
| 2005-302508 | 2008-218784 | 2008-227350 | 2008-227351 | 2008-244067 |
| 2008-267814 | 2008-270405 | 2008-277675 | 2008-277676 | 2008-282840 |
| 2008-283029 | 2008-288305 | 2008-288419 | 2008-300720 | 2008-300721 |
| 2009-4213 | 2009-10001 | 2009-16526 | 2009-21334 | 2009-26933 |
| 2008-147507 | 2008-159770 | 2008-159771 | 2008-171568 | 2008-198388 |
| 2008-218096 | 2008-218264 | 2008-224916 | 2008-235224 | 2008-235467 |
| 2008-241987 | 2008-251274 | 2008-251275 | 2008-252046 | 2008-277428 |

TABLE 2

| | | | | |
|---|---|---|---|---|
| 2006/001461 | 2006/088059 | 2006/098333 | 2006/098336 | 2006/098338 |
| 2006/098335 | 2006/098334 | 2007/001008 | | |

EXAMPLES

The present invention will be described more specifically below with reference to Examples. Materials, amounts, ratios, treatment contents, treatment procedures, and the like, used in Examples, may be appropriately changed without departing from the scope of the present invention. The following specific Examples are therefore to be considered in all respects as illustrative and not restrictive.
(Photosensitive Silver Halide Material)

An emulsion containing an aqueous medium, a gelatin, and silver iodobromochloride particles was prepared. The amount of the gelatin was 10.0 g per 150 g of Ag, and the silver iodobromochloride particles had an I content of 0.2 mol %, a Br content of 40 mol %, and an average spherical equivalent diameter of 0.1 μm.

$K_3Rh_2Br_9$ and $K_2IrCl_6$ were added to the emulsion at a concentration of $10^{-7}$ mol/mol-silver to dope the silver bromide particles with Rh and Ir ions. $Na_2PdCl_4$ was further added to the emulsion, and the resultant emulsion was subjected to gold-sulfur sensitization using chlorauric acid and sodium thiosulfate. The emulsion and a gelatin hardening agent were applied to each of a first transparent substrate 12A and a second transparent substrate 12B (both composed of a polyethylene terephthalate (PET)) such that the amount of the applied silver was 10 g/m². The Ag/gelatin volume ratio was 2/1.

The PET support had a width of 30 cm, and the emulsion was applied thereto into a width of 25 cm and a length of 20 m. The both end portions having a width of 3 cm of the PET support were cut off to obtain a roll photosensitive silver halide material having a width of 24 cm.
(Exposure)

An A4 (210 mm×297 mm) sized area of the first transparent substrate 12A was exposed in the pattern of the first conductive sheet 10A shown in FIGS. 1 and 3, and an A4 sized area of the second transparent substrate 12B was exposed in the pattern of the second conductive sheet 10B shown in FIGS. 3 and 5. The arrangement pitch Ps of the small lattices 18 was 200 μm, and the arrangement pitch Pm of the medium lattices 20 was 2×Ps. The conductive portions of the small lattices 18 had a thickness of 2 μm and a width of 10 μm. The exposure was carried out using a parallel light from a light source of a high-pressure mercury lamp and patterned photomasks as mentioned above.
(Development Treatment)
Formulation of 1 L of Developer

| | |
|---|---|
| Hydroquinone | 20 g |
| Sodium sulfite | 50 g |
| Potassium carbonate | 40 g |
| Ethylenediaminetetraacetic acid | 2 g |
| Potassium bromide | 3 g |
| Polyethylene glycol 2000 | 1 g |
| Potassium hydroxide | 4 g |
| pH | Controlled at 10.3 |

Formulation of 1 L of Fixer

| | |
|---|---|
| Ammonium thiosulfate solution (75%) | 300 ml |
| Ammonium sulfite monohydrate | 25 g |
| 1,3-Diaminopropanetetraacetic acid | 8 g |
| Acetic acid | 5 g |
| Aqueous ammonia (27%) | 1 g |
| pH | Controlled at 6.2 |

The exposed photosensitive materials were treated with the above treatment agents under the following conditions using an automatic processor FG-710PTS manufactured by FUJIFILM Corporation. A development treatment was carried out at 35° C. for 30 seconds, a fixation treatment was carried out at 34° C. for 23 seconds, and then a water washing treatment was carried out for 20 seconds at a water flow rate of 5 L/min.
[Evaluations]
(Surface Resistance Measurement)

In each of the first conductive sheets 10A and the second conductive sheets 10B, the surface resistivity values of optionally selected 10 areas were measured by LORESTA GP (Model No. MCP-T610) manufactured by Dia Instruments Co., Ltd. utilizing an in-line four-probe method (ASP), and the average of the measured values was obtained to evaluate the uniformity of the surface resistivity.
(Visibility Evaluation)

The first conductive sheet 10A and the second conductive sheet 10B were attached together into the touch panel conductive sheet 50. Whether a thickened line or a black point was formed or not was observed by the naked eye.
(Evaluation Results)

The surface resistances of the first conductive sheet 10A and the second conductive sheet 10B were 5 ohm/sq each. It was found that the first conductive sheet 10A and the second conductive sheet 10B were fully applicable to a projected capacitive touch panel having an A4 size.

The touch panel conductive sheet 50 had no confirmed thickened lines and black points and had good visibility.

It is to be understood that the conductive sheet, the conductive sheet using method, and the touch panel of the present invention are not limited to the above embodiments, and various changes and modifications may be made therein without departing from the scope of the present invention.

The invention claimed is:

1. A conductive sheet comprising a substrate (12A), wherein
two or more conductive first large lattices (14A) are formed on one main surface of the substrate (12A),
two or more conductive second large lattices (14B) are formed on the other main surface of the substrate (12A),
the first large lattices (14A) and the second large lattices (14B) each contain a combination of two or more small lattices (18), and
one side of the first large lattices (14A) and one side of the second large lattices (14B) face each other, and shapes of the sides are alternated,
each side of the first large lattices (14A) and the second large lattices (14B) includes two or more rectangular wave shapes, and
sides of the first large lattices (14A) and the second large lattices (14B) have an equivalent shape,
wherein the sides of each of the first large lattices (14A) and the second large lattices (14B) have rectangular wave shapes in which two or more rectangular shapes are arranged, and
one of the sides of each of the first large lattices (14A) faces one of the sides of the second large lattices (14B), and the one of the sides of the second large lattices (14B) has non-protrusive portions facing rectangular protrusive portions of the one of the sides of each of the first large lattices (14A) and rectangular protrusive portions facing non-protrusive portions of the one of the sides of each of the first large lattices (14A).

2. The conductive sheet according to claim 1, wherein the rectangular shapes of the sides of each of the first large lattices (14A) and the second large lattices (14B) comprise the small lattices (18).

3. A conductive sheet comprising a substrate (12A), wherein
two or more conductive first large lattices (14A) are formed on one main surface of the substrate (12A),
two or more conductive second large lattices (14B) are formed on the other main surface of the substrate (12A),
the first large lattices (14A) and the second large lattices (14B) each contain a combination of two or more small lattices (18), and
one side of the first large lattices (14A) and one side of the second large lattices (14B) face each other, and shapes of the sides are alternated,
each side of the first large lattices (14A) and the second large lattices (14B) includes two or more rectangular wave shapes, and
sides of the first large lattices (14A) and the second large lattices (14B) have an equivalent shape, wherein
a first connection (16A) is formed on the one main surface of the substrate (12A) and electrically connects the adjacent first large lattices (14A),
a second connection (16B) is formed on the other main surface of the substrate (12A) and electrically connects the adjacent second large lattices (14B),
the two or more first large lattices (14A) are arranged in a first direction with the first connection (16A) disposed therebetween to form a first conductive pattern (22A),
the two or more second large lattices (14B) are arranged in a second direction, which is perpendicular to the first direction, with the second connection (16B) disposed therebetween to form a second conductive pattern (22B),
two or more of the first conductive patterns (22A) are arranged in the second direction,
two or more of the second conductive patterns (22B) are arranged in the first direction,
an electrically isolated first insulation (24A) is disposed between the adjacent first conductive patterns (22A),
an electrically isolated second insulation (24B) is disposed between the adjacent second conductive patterns (22B),
the first connection (16A) and the second connection (16B) are arranged facing each other with the substrate (12A) in between, and
the first insulations (24A) and the second insulations (24B) are arranged facing each other with the substrate (12A) in between.

4. A conductive sheet for a touch panel comprising a first conductive sheet and a second conductive sheet, wherein
the first conductive sheet and the second conductive sheet are stacked,
the first conductive sheet includes two or more conductive first large lattices composed of a thin metal wire formed on one main surface of a first transparent substrate,
the second conductive sheet includes two or more conductive second large lattices composed of a thin metal wire formed on one main surface of a second transparent substrate,
one side of the first large lattices and one side of the second large lattices that face each other have alternated shapes,
each side of the first large lattices and the second large lattices includes two or more protruding rectangular wave shapes,
sides of each of the first large lattices and the second large lattices have an equivalent shape,
wherein
the sides of each of the first large lattices and the second large lattices have rectangular wave shapes in which two or more rectangular shapes are arranged, and
one of the sides of each of the first large lattices faces one of the sides of the second large lattices, and the one of the sides of the second large lattices has non-protrusive portions facing rectangular protrusive portions of the one of the sides of each of the first large lattices, and rectangular protrusive portions facing non-protrusive portions of the one of the sides of each of the first large lattices.

5. A conductive sheet for a touch panel comprising a first conductive sheet and a second conductive sheet, wherein
the first conductive sheet and the second conductive sheet are stacked,
the first conductive sheet includes two or more conductive first large lattices composed of a thin metal wire formed on one main surface of a first transparent substrate,
the second conductive sheet includes two or more conductive second large lattices composed of a thin metal wire formed on one main surface of a second transparent substrate,
one side of the first large lattices and one side of the second large lattices that face each other have alternated shapes,
each side of the first large lattices and the second large lattices includes two or more protruding rectangular wave shapes,
sides of each of the first large lattices and the second large lattices have an equivalent shape,
wherein
a first connection is formed on one main surface of the first transparent substrate and electrically connects the adjacent first large lattices,
a second connection is formed on one main surface of the second transparent substrate and electrically connects the adjacent second large lattices,
the two or more of the first large lattices are arranged in a first direction with the first connection disposed therebetween to form a first conductive pattern,
the two or more of the second large lattices are arranged in a second direction, which is perpendicular to the first direction, with the second connection disposed therebetween to form a second conductive pattern,
two or more of the first conductive patterns are arranged in the second direction,
two or more of the second conductive patterns are arranged in the first direction,
an electrically isolated first insulation is disposed between the adjacent first conductive patterns,
an electrically isolated second insulation is disposed between the adjacent second conductive patterns,
the first connection and the second connection are arranged facing each other with the substrate in between, and
the first insulations and the second insulations are arranged facing each other with the substrate in between.

\* \* \* \* \*